United States Patent
Tanaka

[19]

[11] Patent Number: 5,909,009
[45] Date of Patent: Jun. 1, 1999

[54] LAMINATE ORGANIC RESIN WIRING BOARD AND METHOD OF PRODUCING THE SAME

[75] Inventor: Shinji Tanaka, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/662,005

[22] Filed: Jun. 12, 1996

[30] Foreign Application Priority Data

Jun. 14, 1995 [JP] Japan ................................. 7-146643

[51] Int. Cl.⁶ .................................................. H05K 1/14
[52] U.S. Cl. ........................................ 174/255; 174/266
[58] Field of Search ................................ 174/255, 265, 174/266; 361/792, 795

[56] References Cited

U.S. PATENT DOCUMENTS

| | | | |
|---|---|---|---|
| 4,679,321 | 7/1987 | Plonski | 29/850 |
| 5,191,174 | 3/1993 | Chang et al. | 174/266 |
| 5,258,236 | 11/1993 | Arjavalingam et al. | |
| 5,321,210 | 6/1994 | Kimbara et al. | |
| 5,340,947 | 8/1994 | Credle et al. | 174/262 |
| 5,350,886 | 9/1994 | Miyazaki et al. | 174/250 |
| 5,382,757 | 1/1995 | Ishida | 174/262 |
| 5,435,480 | 7/1995 | Hart et al. | 228/180.1 |
| 5,534,666 | 7/1996 | Ishida | 174/260 |
| 5,590,461 | 1/1997 | Ishida | 29/830 |

FOREIGN PATENT DOCUMENTS

| | | | |
|---|---|---|---|
| 0481736 | 4/1992 | European Pat. Off. | |
| 0624904 | 11/1994 | European Pat. Off. | |
| 5-206643 | 8/1983 | Japan | H05K 3/46 |
| 4-1522694 | 5/1992 | Japan | H05K 3/46 |

*Primary Examiner*—Kristine Kincaid
*Assistant Examiner*—William Silverio
*Attorney, Agent, or Firm*—Sughrue, Mion, Zinn, Macpeak & Seas, PLLC

[57] ABSTRACT

A laminate organic resin wiring board and a method of producing the same are disclosed. The wiring board has a plurality of subassemblies each having a conductive resin layer serving as a ground or feed layer on its top. The subassemblies are adhered to each other at their conductive resin layers. This successfully eliminates the need for an organic resin layer for insulation customarily formed on the top of the individual subassembly. The decrease in the number of layers reduces the period of time necessary for the production of the wiring board.

3 Claims, 8 Drawing Sheets

LAMINATE ORGANIC RESIN WIRING BOARD AND METHOD OF PRODUCING THE SAME

BACKGROUND OF THE INVENTION

The present invention relates to a laminate organic resin wiring board and a method of producing the same and, more particularly, to a laminate organic resin wiring board consisting of a plurality of laminate blocks adhered together, and a method of producing the same.

Today, a laminate wiring board having a ceramic substrate and polyimide resin intervening between nearby layers for an insulation purpose is used as a wiring board for a large scale computer that needs dense wiring. It has been customary to produce this kind of polyimide-ceramic laminate wiring board by the steps of forming a polyimide resin insulating layer on the ceramic substrate, and forming wiring by photolithography, vacuum deposition, and plating. To form the polyimide resin insulating layer, polyimide precursor varnish is applied to the substrate and dried, and then via holes are formed in the resulting polyimide film. The above steps are repeated to produce a laminate polyimide wiring layer.

Another conventional method produces a laminate polyimide wiring board by dividing the substrate into a plurality of blocks, as taught in Japanese Patent Laid-Open Publication No. 5-206643 (Prior Art 1) by way of example. In Prior Art 1, a plurality of blocks produced beforehand are adhered together in order to complete the laminate wiring board. This kind of method is also disclosed in Japanese patent Laid-Open Publication No. 4-152694 (Prior Art 2). The difference between Prior Art 1 and Prior Art 2 is that while the former uses metal bumps for the electrical connection of wiring layers, the latter uses via holes for the same purpose.

However, Prior Art 1 and Prior Art 2 both have the following problem left unsolved. In Prior Art 1 and Prior Art 2, two laminate blocks each has a ground or feed layer, a polyimide insulating layer, a signal layer, a polyimide insulating layer, a ground or feed layer and a polyimide insulating layer sequentially laminated from the bottom to the top. The polyimide insulating layers or top layers of the laminate blocks are adhered to each other. The wiring board therefore needs a great number of layers. It follows that an increase in the number of layers directly translates into an increase in the period of time necessary for the production of the wiring board.

SUMMARY OF THE INVENTION

It is therefore an object of the present invention to provide a laminate organic resin wiring board needing only a small number of layers.

In accordance with the present invention, a laminate organic resin wiring board has a plurality of laminate blocks each having a plurality of conductive wiring layers and a plurality of organic resin insulating layers alternating with each other, and having the organic resin layer on the top thereof. A conductive resin layer is formed on the top of the organic resin layer provided on the top. Metal bumps are electrically connected to the conductive wiring layers via via holes formed in the surface of the conductive resin layer.

Also, in accordance with the present invention, in a wiring board consisting of two laminate organic resin wiring boards, the laminate organic resin wiring boards each has a plurality of laminate blocks each having a plurality of conductive wiring layers and a plurality of organic resin insulating layers alternating with each other, and having the organic resin layer on the top thereof. A conductive resin layer is formed on the top of the organic resin layer provided on the top. Metal bumps are electrically connected to the conductive wiring layers via via holes formed in the surface of the conductive resin layer. The conductive resin layers of the laminate organic resin wiring boards are adhered to each other while the conductive resin layers of the laminate organic resin wiring boards are adhered to each other.

Further, in accordance with the present invention, a method of producing a laminate organic resin wiring board has the steps of forming a laminate block having a plurality of conductive wiring layers and a plurality of organic resin insulating layers formed alternately on a hard sheet, and having the organic resin insulating layer on the top thereof, forming a conductive resin layer on the top of the organic resin insulating layer formed on the top, forming via holes in the surface of the conductive resin layer, and forming metal bumps to be connected to the plurality of conductive wiring layers via the via holes, electrically connecting two laminate subassemblies produced by the above steps at the conductive resin layers and the metal bumps, separating the hard sheet from one of the two subassemblies, and providing pads on the surface of the one subassembly from which the hard sheet has been separated. The pads are to be electrically connected to the conductive wiring layers.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

A method of producing a laminate organic resin wiring board embodying the present invention will be described with reference to the accompanying drawings. First, the configurations of two subassemblies A and B constituting the wiring board will be described.

Figure 9:
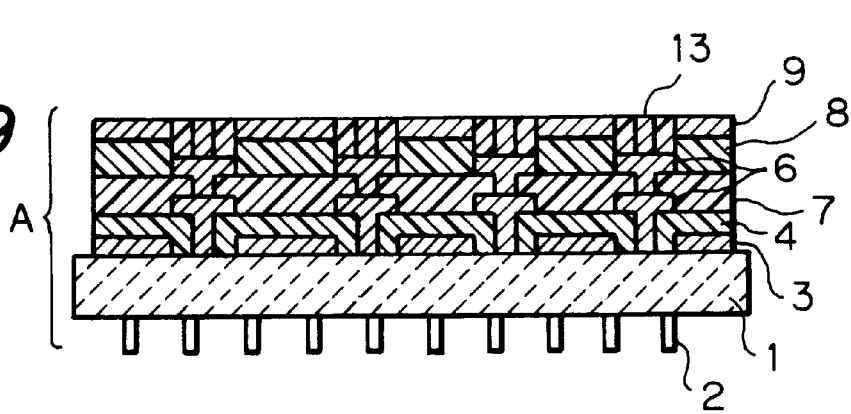

FIG. 9 shows the subassembly A in its completed condition. As shown, the subassembly A has a ceramic substrate 1 provided with input/output pins or power supply pins 2. A first ground of feed layer 3, polyimide resin 4, a signal wiring 6, polyimide resin 7, another signal wiring 6, polyimide resin 8 and a second ground or feed layer (referred to as a conductive resin layer hereinafter) 9 are sequentially formed on the top of the ceramic substrate 1. Metal bumps 13 are formed on the top of the subassembly A and electrically connected to the signal wirings 6. The two signal wirings 6 are provided in a pair.

Figure 18:
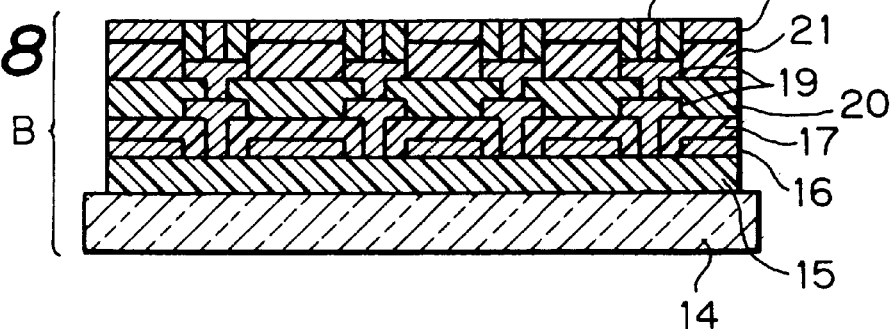

FIG. 18 shows the other subassembly B in its completed condition. As shown, the subassembly B has a flat sheet of quartz glass 14. A polyimide resin 15, a first ground or feed layer 16, polyimide resin 17, a signal wiring 19, polyimide resin 20, another signal wiring 19, polyimide resin 21 and a second ground or feed layer (referred to as a conductive resin layer hereinafter) 22 are sequentially laminated on the top of the quartz glass sheet 14. Metal bumps 26 are formed on the top of the subassembly A and electrically connected to the signal wirings 19. Again, the signal wirings 19 are provided in a pair.

Figure 19:
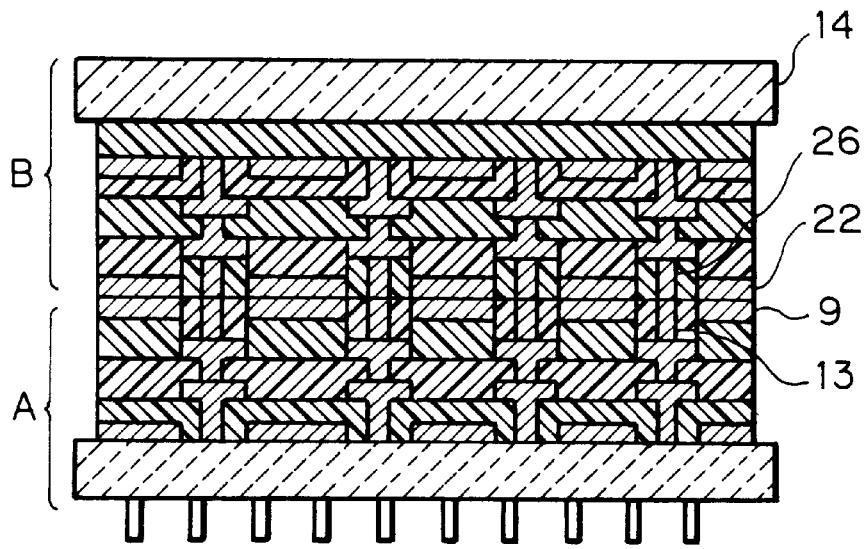
FIGS. 19 through 26 show a sequence of steps for assembling the subassemblies A and B together.

FIG. 19 shows the two subassemblies A and B in their temporary affixed condition. As shown, the conductive resin layers 9 and 22 of the subassemblies A and B, respectively, are positioned on each other and then temporarily affixed to each other. Subsequently, the quartz glass sheet 14 is removed from the assembly, as will be described specifically later.

In the illustrative embodiment, insulating films intervening between nearby wiring layers are 20 $\mu$m thick each while the wirings are 25 $\mu$m wide and 10 $\mu$m thick each. Via holes for interconnecting the wirings, as will be described, each has a diameter of 100 $\mu$m. The polyimide resin is implemented by photosensitive polyimide having a small coefficient of thermal expansion. For the conductive resin, use is made of thermosetting conductive epoxy resin containing a silver filler. The wirings are formed of gold. It is to be noted that the polyimide having a small coefficient of thermal expansion refers to one whose coefficient of thermal expansion ranges from 10 ppm to 30 ppm.

Figure 1:
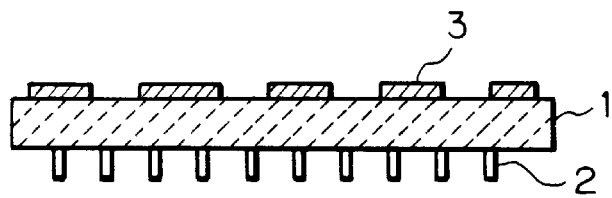
FIGS. 1 through 9 show a sequence of steps for producing a subassembly A forming a part of a laminate organic resin wiring board embodying the present invention.
Figure 2:
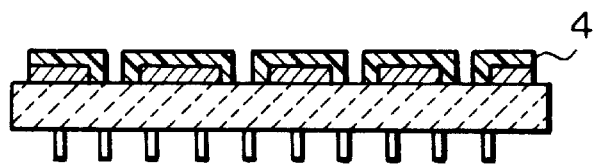
Figure 3:
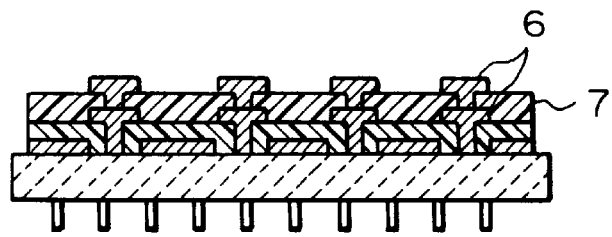

A procedure of completing the above laminate wiring board assembly is as follows. First, the subassembly A is produced by the following sequence of steps. As shown in FIG. 1, the first ground or feed layer 3 is patterned on the ceramic substrate 1 carrying the input/output pins or power supply pins 2 on its rear, and then subjected to electrolytic gold plating (step 1). For the patterning of the layer 3, use is made of photolithography using photoresist. Next, as shown in FIG. 2, the polyimide resin 4 in the form of photosensitive polyimide varnish having a small coefficient of thermal expansion is applied to the substrate 1 having the layer 3, and then formed with via holes 5 at its preselected positions by exposure and development, and then cured (step 2). Subsequently, as shown in FIG. 3, a pair of signal wiring layers 6 are formed one upon the other with the intermediary of the photosensitive polyimide 7 having a small coefficient of thermal expansion (step 3). Specifically, the signal wiring layers 6 are formed by the same method as used to form the ground or feed layer 3 in the step 1, and an insulating layer is formed by the same method as used to form an insulating layer in the step 2.

Figure 4:
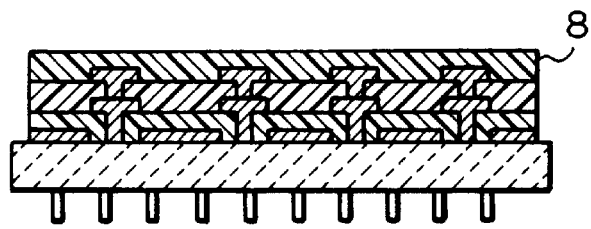
Figure 5:
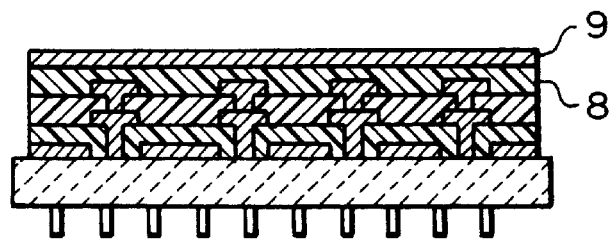
Figure 6:
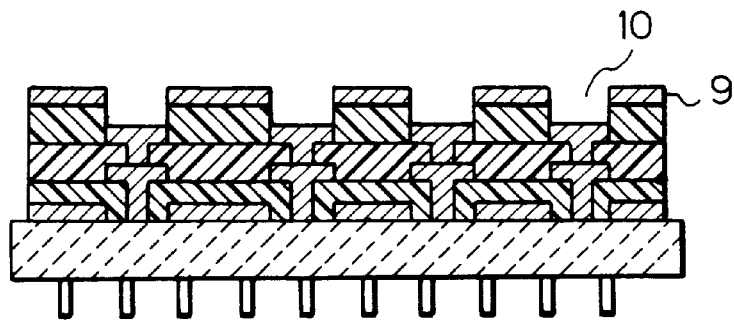
Figure 7:
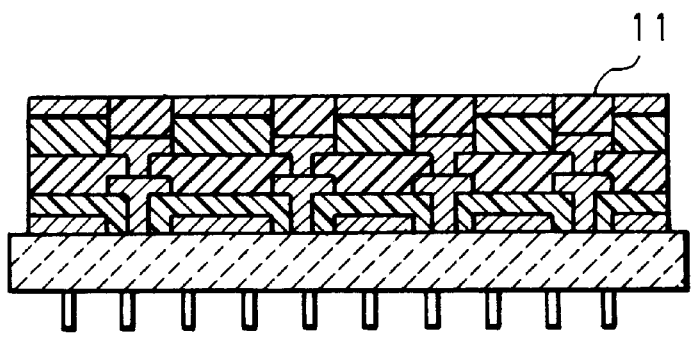
Figure 8:
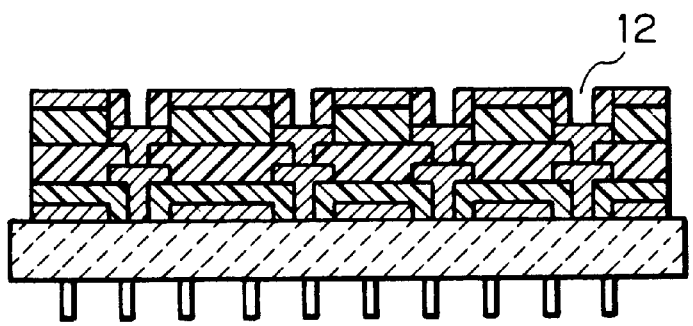

Subsequently, as shown in FIG. 4, the polyimide resin 8 in the form of photosensitive polyimide varnish having a small coefficient of thermal expansion is applied to the signal wiring 6, and then cured (step 4). Then, as shown in FIG. 5, thermosetting conductive epoxy resin with a silver filler (conductive resin) is fed to the polyimide layer 8 by a dispenser or screen printing in order to form the conductive resin layer 9 (20 $\mu$m thick) (step 5). This is followed by a step of forming a photoresist pattern on the conductive resin layer 9 by photolithography, and then illuminating the pattern with an excimer laser to form via holes 10 each having a radius of 200 $\mu$m (step 6), as shown in FIG. 6. As shown in FIG. 7, photosensitive polyimide varnish 11 having a small coefficient of thermal expansion is buried in the via holes 10 (step 7). Subsequently, as shown in FIG. 8, via holes 12 each having a diameter of 100 $\mu$m are formed by exposure and development, and then cured (step 8). Thereafter, as shown in FIG. 9, the metal bumps 13 are formed in the via holes 12 at positions where they will be electrically connected to the laminate wiring layer of the other subassembly B (step 9). This completes the subassembly A.

The metal bumps 13 are formed by photolithography using photoresist, and plating. The bump metal consists of four consecutive layers formed by electrolytic plating, i.e., a nickel layer, a gold layer, a tin layer, and a gold layer, as named from the wiring pattern side. These four consecutive metal layers are 3 $\mu$m thick, 8 $\mu$m thick, 11 $\mu$m thick, and 8 $\mu$m thick, respectively. If desired, the 3 $\mu$m thick nickel layer may be plated to form a 30 $\mu$m thick tin/lead solder layer thereon. In such a case, the ratio of tin to lead is eutectic (63/37) or 95:5.

Figure 10:
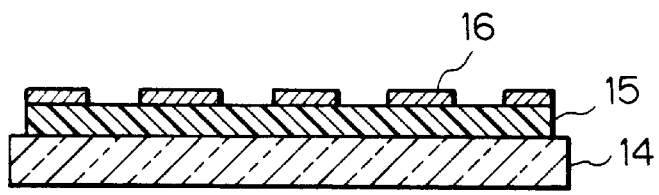
FIGS. 10 through 18 show a sequence of steps for producing a subassembly B forming the other part of the wiring board embodying the present invention.
Figure 11:
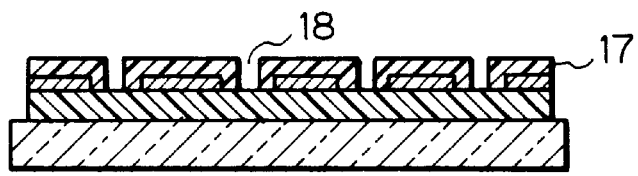
Figure 12:
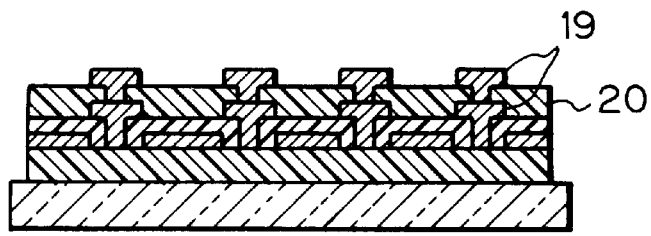

The other subassembly B is produced by the following sequence of steps. First, as shown in FIG. 10, a 10 $\mu$m thick uniform layer of photosensitive polyimide 15 having a small coefficient of thermal expansion is formed on the 2 mm thick quartz glass sheet 14, and then the ground or feed layer 16 is formed on the layer 15 by photolithography using photoresist (step 10). Next, as shown in FIG. 11, the photosensitive polyimide varnish 17 having a small coefficient of thermal expansion is applied to the quartz glass sheet 14 having the ground or feed layer 16, then formed with via holes 18 by exposure and development, and then cured (step 11). This is followed by a step of forming a pair of signal wiring layers 19 with the intermediary of the photosensitive polyimide 20 having a small coefficient of thermal expansion for insulation, as shown in FIG. 12 (step 12). Specifically, the wiring layers 19 are formed by the same method as used to form the ground or feed layer 16 in the step 10, and the insulating layer 20 is formed by the method used to form the insulating layer in the step 3.

Figure 13:
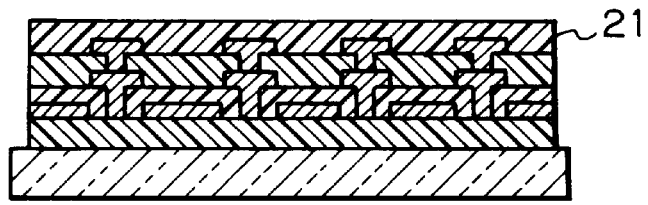
Figure 14:
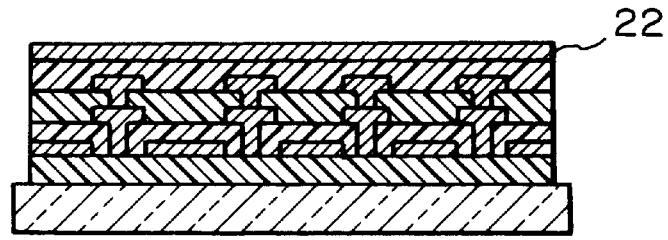
Figure 15:
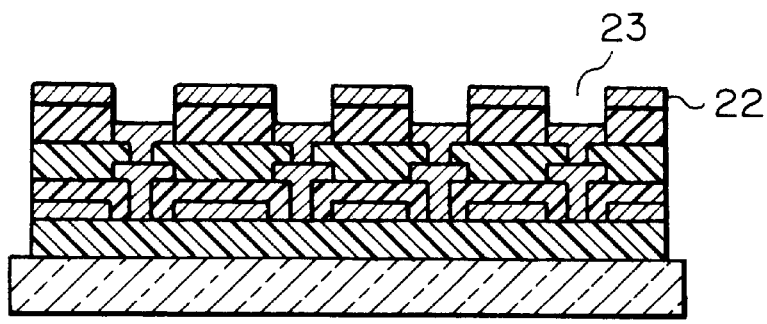
Figure 16:
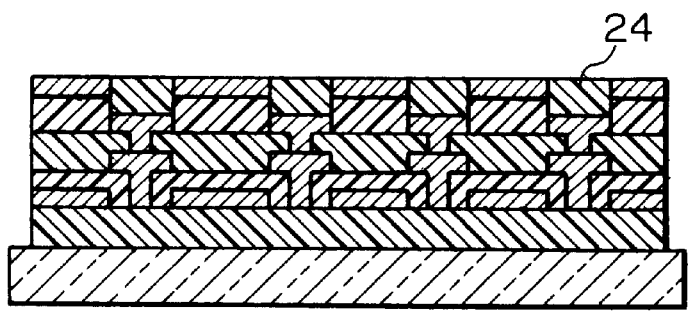
Figure 17:
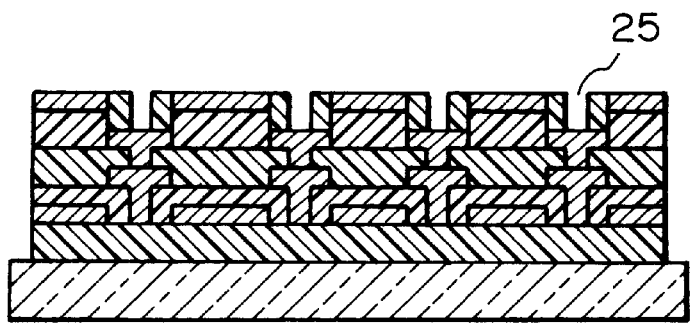

Subsequently, as shown in FIG. 13, the polyimide insulating layer 21 is formed on the signal wiring layer 19 by the same method as in the step 4 (step 13). As shown in FIG. 14, the conductive resin layer 22 is formed on the insulating layer 21 by the same method as in the step 5 (step 14). As shown in FIG. 15, via holes 23 each having a diameter of 200 $\mu$m are formed in the conductive resin layer 22 by the same method as in the step 6 (step 15). As shown in FIG. 16, photosensitive polyimide varnish 24 having a small coefficient of thermal expansion is buried in the via holes 23 (step 16). Subsequently, as shown in FIG. 17, via holes 25 each having a diameter of 100 $\mu$m is formed and then cured (step 17). As shown in FIG. 18, the metal bumps 26 are formed in the via holes 25 at positions for electrical connection by the same method as in the step 9 (step 18). This completes the subassembly B.

Figure 20:
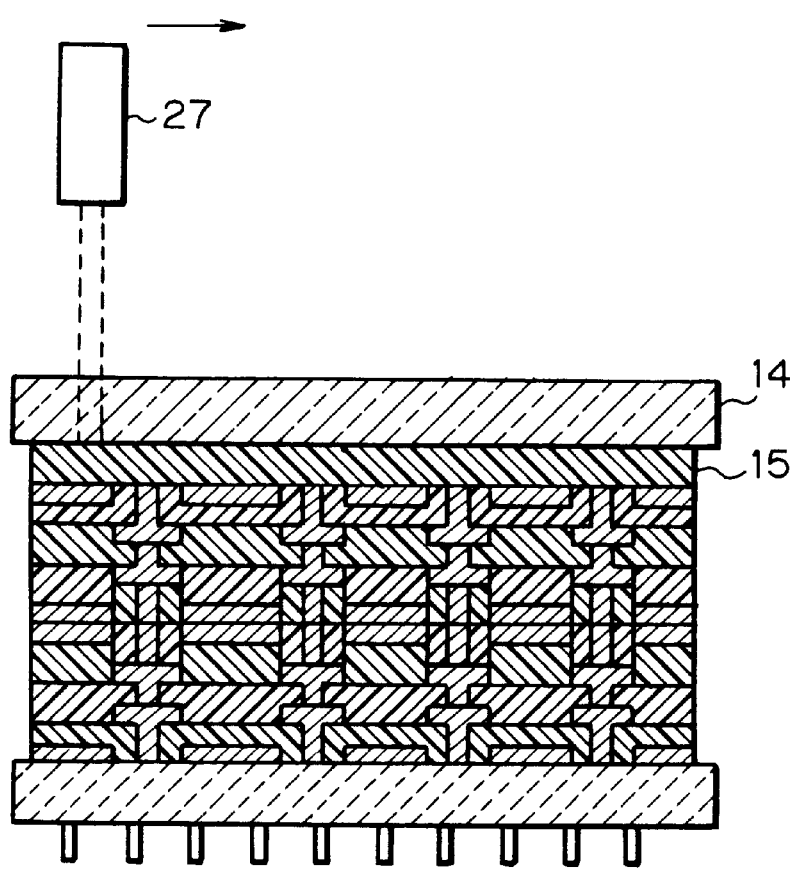
Figure 21:
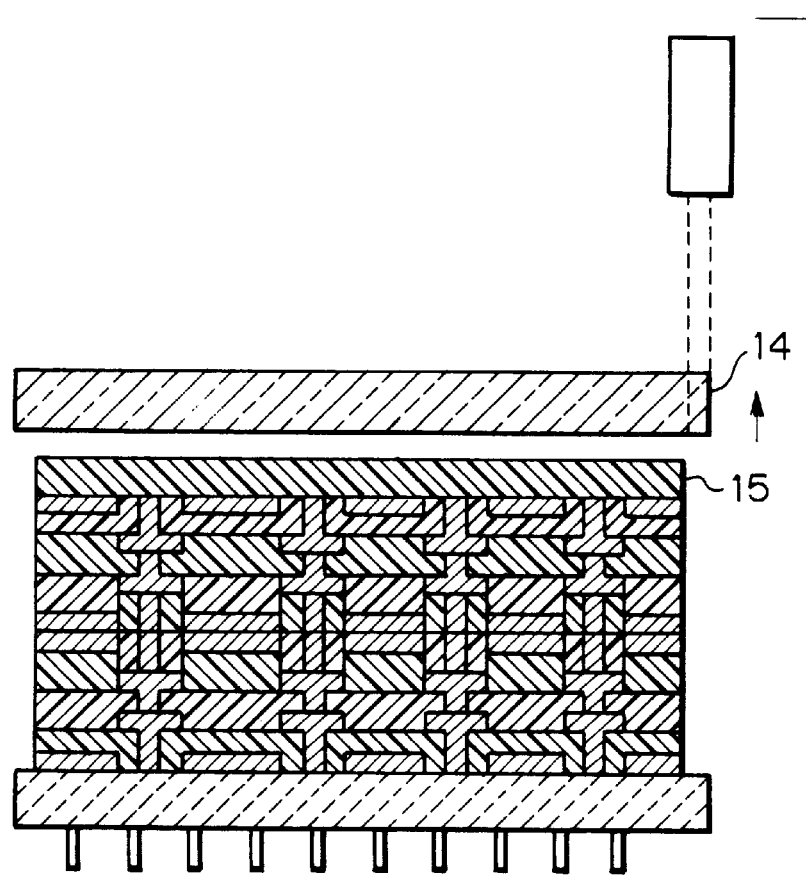
Figure 22:
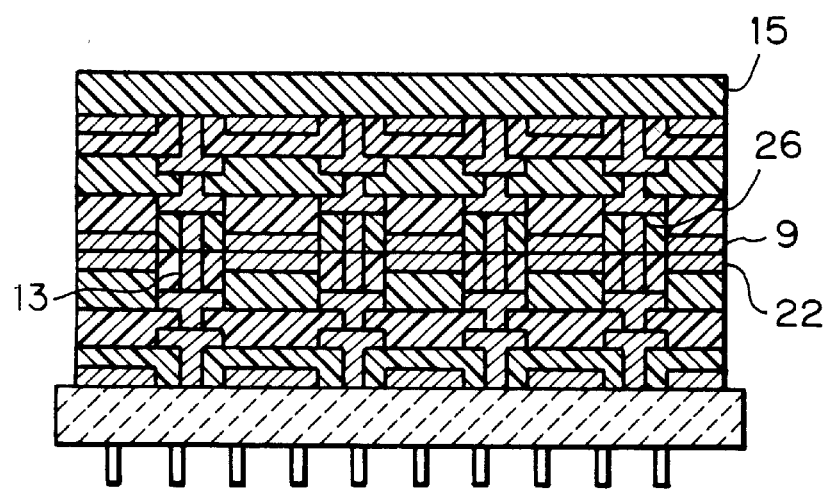
Figure 23:
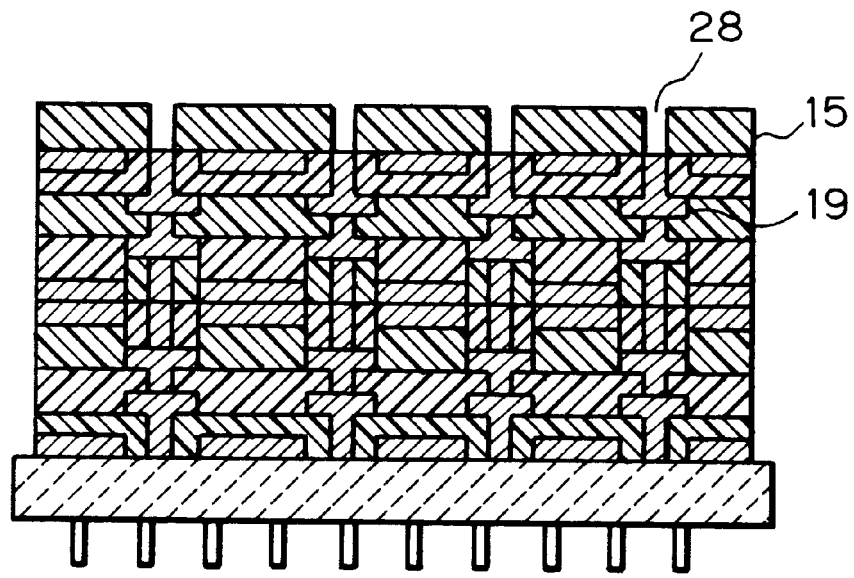
Figure 24:
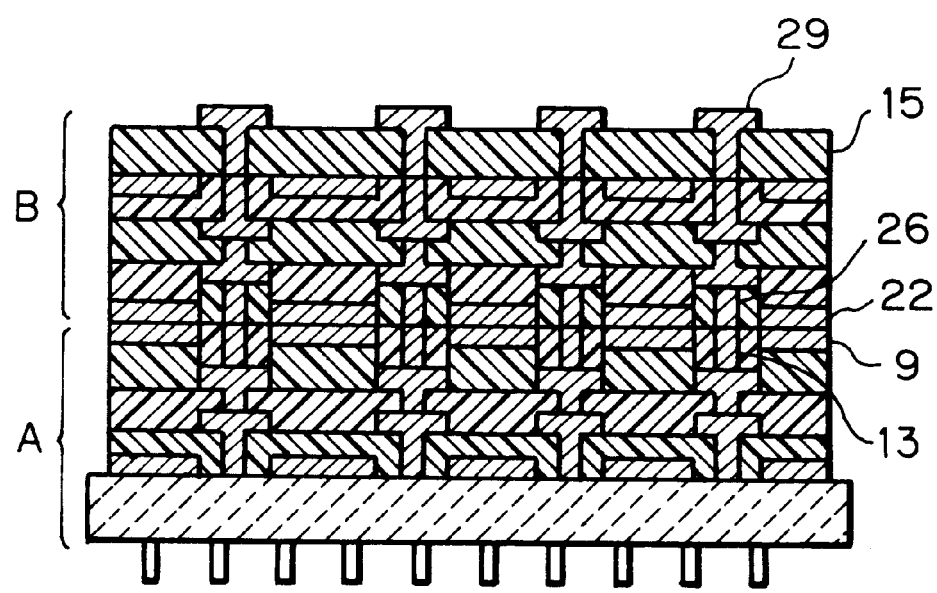

A procedure for adhering the two subassemblies A and B is as follows. As shown in FIG. 19, after the metal bumps 13 and 26 of the subassemblies A and B, respectively, have been positioned on each other, cyanoacrylate-based adhesive in a gel stated is applied to the conductive resin layers 9 and 22 by a dispenser in order to temporarily affix them to each other (step 19). As shown in FIG. 20, the temporarily affixed assembly is illuminated by an excimer laser 27 from the quartz glass sheet 14 side (step 20). As a result, as shown in FIGS. 21 and 22, the polyimide at the interface between the quartz glass sheet 14 and the polyimide layer 15 is removed by photochemical reaction, so that the sheet 14 can be separated from the assembly. Specifically, the polyimide can be removed by about 1 $\mu$m when a laser gas is implemented by KrF, energy density is 0.8 J/cm$^2$, and frequency is 50 Hz. 1 0 As shown in FIG. 23, the polyimide 15 newly appeared on the assembly in the above step 20 is subjected to dry etching in order to form via holes 28 in alignment with the signal wirings 19 (step 21). As shown in FIG. 24, pads 29 for the connection of an LSI (Large Scale Integrated circuit) are formed in the via holes 28 (step 22). For this purpose, photoresist may be patterned by photolithography and then plated with copper. Finally, the conductive resin layers 9 and 22 of the subassemblies A and B, respectively, are adhered by heat and pressure, and then the metal bumps 13 and 26 are electrically connected (step 23).

Figure 25:
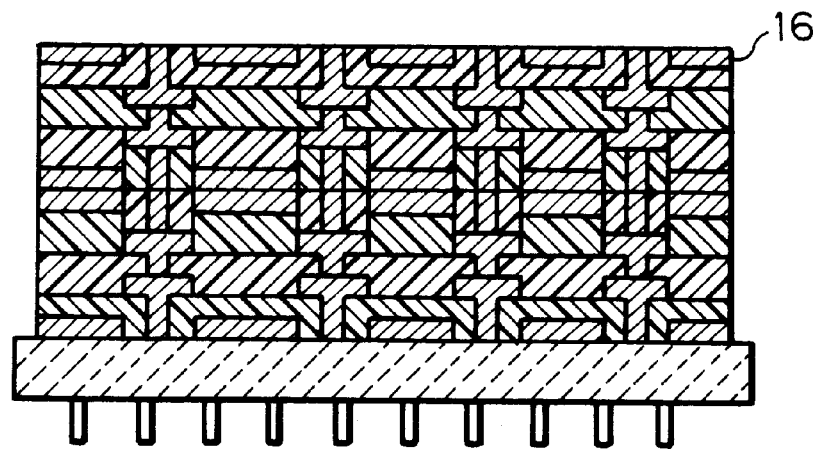
Figure 26:
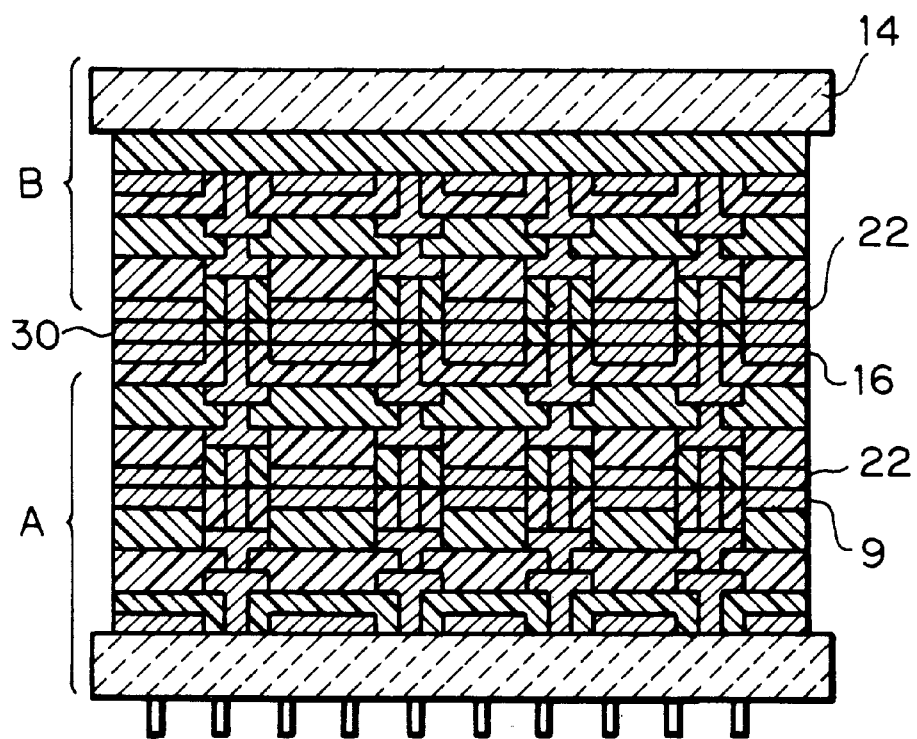

A plurality of subassemblies B may be laminated together and then adhered to the subassembly A, as follows. The procedure to be described is identical with the above procedure up to the step 20 (FIG. 22). The step 20 is followed by a step 24 for fully removing the polyimide layer 15 by dry etching so as to expose the conductive resin layer 16 to the outside, as shown in FIG. 25. Next, a new conductive resin layer 30 is formed on the conductive resin layer 16, and then the subassembly B prepared by the steps 10–18 is positioned on the layer 30 (step 25). If another subassembly B is to be laminated, then the above steps 20, 21, 22, 24 and 25 will be repeated (step 26). Thereafter, the procedure returns from the step 25 to the step 20 and then repeats the steps 20, 21, 22 and 23 (step 27).

The ceramic substrate 1 may be replaced with a polyimide substrate, if desired.

The process for forming the metal bumps 13 and 26 consists of the following steps. First, the through holes 10 and 20 are formed in the conductive resin layers 9 and 22, respectively. Then, the through holes 10 and 23 are filled with the organic resins 11 and 24, respectively. The via holes 12 and 25 smaller in diameter than the through holes 10 and 23 are formed in the organic resins 11 and 24, respectively. Subsequently, the metal bumps 13 and 26 are formed in the via holes 12 and 25, respectively. Finally, the metal bumps 13 and 26 are electrically connected to the conductive wiring layers 6 and 19, respectively.

In summary, in accordance with the present invention, a laminate organic resin wiring board has a plurality of subassemblies each having a conductive resin layer serving as a ground or feed layer on its top. The subassemblies are adhered to each other at their conductive resin layers. This successfully eliminates the need for an organic resin layer for insulation customarily formed on the top of the individual subassembly. The decrease in the number of layers directly reduces the period of time necessary for the production of the wiring board.

Various modifications will become possible for those skilled in the art after receiving the teachings of the present disclosure without departing from the scope thereof.

What is claimed is:

1. A laminate organic resin wiring board comprising:

a plurality of laminate blocks each having (1) a plurality of conductive wiring layers and a plurality of organic resin insulating layers alternating with each other, such that one of said organic resin insulating layers is provided as an outermost layer thereof, and (2) a conductive resin layer formed on the outside surface of said outermost organic resin insulating layer; and metal bumps extending through via holes formed in said conductive resin layer and electrically connecting said plurality of conductive wiring layers of said plurality of laminate blocks;

wherein said conductive resin layer comprises one of a ground layer and a feed layer and said conductive resin layers of said laminate blocks are adhered to each other by heat and pressure.

2. A wiring board as claimed in claim 1, wherein said plurality of organic resin insulating layers are formed of a polyimide resin.

3. In a wiring board consisting of a plurality of laminate blocks, said laminate blocks each comprising:

a plurality of conductive wiring layers and a plurality of organic resin insulating layers alternating with each other, such that one of said organic resin insulating layers is provided as an outermost layer thereof;

a conductive resin layer formed on the outside surface of said outermost organic resin insulating layer; and metal bumps electrically connected to said plurality of conductive wiring layers and extended through via holes formed in said conductive resin layer;

wherein said conductive resin layers of said laminate blocks are adhered to each other by heat and pressure and said metal bumps of said laminate blocks are adhered to each other.

\* \* \* \* \*

UNITED STATES PATENT AND TRADEMARK OFFICE
CERTIFICATE OF CORRECTION

PATENT NO.    : 5,909,009                                    Page 1 of 1
DATED         : June 1, 1999
INVENTOR(S)   : Shinji Tanaka It is certified that error appears in the above-identified patent and that said Letters Patent is hereby corrected as shown below:

<u>Column 4,</u>
Line 61, delete "10"

Signed and Sealed this

Ninth Day of September, 2003

JAMES E. ROGAN
*Director of the United States Patent and Trademark Office*